US009344217B2

(12) United States Patent
Chui et al.

(10) Patent No.: US 9,344,217 B2
(45) Date of Patent: May 17, 2016

(54) DEVICES AND METHODS FOR RECONSTRUCTING CORRUPTED CONTROL CHANNEL BITS

(71) Applicant: QUALCOMM Incorporated, San Diego, CA (US)

(72) Inventors: Jimmy Chi-Wai Chui, San Francisco, CA (US); Nate Chizgi, Sunnyvale, CA (US); Abhinav Gupta, San Jose, CA (US); Amith Vikram Chincholi, Sunnyvale, CA (US); Chulong Chen, San Jose, CA (US)

(73) Assignee: QUALCOMM Incorporated, San Diego, CA (US)

(*) Notice: Subject to any disclaimer, the term of this patent is extended or adjusted under 35 U.S.C. 154(b) by 114 days.

(21) Appl. No.: 14/220,973

(22) Filed: Mar. 20, 2014

(65) Prior Publication Data

US 2015/0033098 A1    Jan. 29, 2015

Related U.S. Application Data

(60) Provisional application No. 61/859,084, filed on Jul. 26, 2013.

(51) Int. Cl.
| | |
|---|---|
| H04L 1/00 | (2006.01) |
| G06F 11/10 | (2006.01) |
| H03M 13/09 | (2006.01) |
| H03M 13/37 | (2006.01) |

(Continued)

(52) U.S. Cl.
CPC .......... H04L 1/0045 (2013.01); G06F 11/1004 (2013.01); H03M 13/09 (2013.01);
(Continued)

(58) Field of Classification Search
CPC ...................................................... H04L 7/048
USPC .................................. 714/776, 749; 370/332
See application file for complete search history.

(56) References Cited

U.S. PATENT DOCUMENTS 4,447,902 A * 5/1984 Wilkinson .............. G06F 11/10
360/48
6,334,219 B1 * 12/2001 Hill ......................... G06F 17/14
341/100

(Continued)

FOREIGN PATENT DOCUMENTS

| EP | 1361707 A2 | 11/2003 |
| EP | 1819058 A1 | 8/2007 |

OTHER PUBLICATIONS

3GPP TSG RAN WG2, ETSI MCC: "R2-120915 Report of 3GPP TSG RAN WG2 meeting #76 (passage)", XP002732275, Feb. 19, 2012, 3 pages.

(Continued)

*Primary Examiner* — Fritz Alphonse
(74) *Attorney, Agent, or Firm* — Loza & Loza LLP

(57) ABSTRACT

UEs are adapted to facilitate reconstruction of a segment of corrupted bits. According to one example, a UE can receive a control channel transmission such as a HS-SCCH transmission. The control channel transmission may include a plurality of information bits and a plurality of cyclic redundancy check (CRC) bits. The UE may further determine that a contiguous segment of the received information bits is corrupt. The UE may accordingly utilize the uncorrupted information bits and CRC bits to reconstruct the corrupt information bits. In some instances, the UE may utilize the uncorrupted bits to reconstruct the corrupt information bits using a new generator polynomial. In other instances, the UE may utilize the uncorrupted bits to reconstruct the corrupt information bits using the original generator polynomial.

29 Claims, 9 Drawing Sheets

(51) Int. Cl.
*H03M 13/00* (2006.01)
*H04L 1/18* (2006.01)
(52) U.S. Cl.
CPC ........... *H03M 13/37* (2013.01); *H03M 13/653* (2013.01); *H04L 1/0061* (2013.01); *H04L 1/1822* (2013.01); *H04L 1/1835* (2013.01)

(56) References Cited

U.S. PATENT DOCUMENTS

| | | | |
|---|---|---|---|
| 6,430,233 | B1 | 8/2002 | Dillon et al. |
| 2005/0233754 | A1 | 10/2005 | Beale et al. |
| 2006/0041826 | A1 | 2/2006 | Bhattacharya et al. |
| 2008/0225765 | A1 | 9/2008 | Marinier et al. |
| 2010/0312994 | A1 | 12/2010 | McBeath et al. |
| 2013/0028212 | A1 | 1/2013 | Lohr et al. |
| 2013/0182685 | A1 | 7/2013 | Yu et al. |
| 2013/0223377 | A1 | 8/2013 | Doppler et al. |
| 2013/0235748 | A1 | 9/2013 | Fong et al. |
| 2013/0272192 | A1 | 10/2013 | Chang et al. |
| 2013/0272291 | A1 | 10/2013 | Mukherjee et al. |

OTHER PUBLICATIONS

3GPP TSG-RAN WG2, Qualcomm Europe: "R2-096840 Email discussion outcome for [67b#19] UMTS; DC-HSUPA in 25.321 (pasage)", Nov. 2, 2009, XP002732274, pp. 1-4.

Ed M. J. J., "Burst Erasure Correction to Improve the Efficiency of Broadband CSMA/CD", Institute of Electrical and Electronics Engineers, The 2002 45th. Midwest Symposium on Circuits and Systems. Conference Proceedings. Tulsa, OK, Aug. 4-7, 2002; [Midwest Symposium on Circuits and Systems], New York, NY : IEEE, US, vol. 2, XP010635389,ISBN: 978-0-7803-7523-9, Aug. 4, 2002, pp. 318-321.

Ericsson, et al., "Soft Buffer Handling in MAC", 3GPP Draft; R2-116350-Soft Buffer Handling in MAC, 3rd Generation Partnership Project (3GPP), Mobile Competence Centre ; 650, Route Des Lucioles ; F-06921 Sophia-Antipolis Cedex; France, vol. RAN WG2, no. San Francisco, United States; 20111114-20111118, XP050564557, Nov. 10, 2011.

Forney G., "Burst-Correcting Codes for the Classic Bursty Channel", IEEE Transactions on Communications Technology, US, IEEE Inc, vol. 12, No. 5, Oct. 1, 1971, ISSN: 0018-9332, XP011218605, pp. 772-781.

International Search Report and Written Opinion—PCT/US2014/046797—ISA/EPO—Nov. 24, 2014.

Song S. et al., "Burst Decoding of Cyclic Codes Based on Circulant Parity-Check Matrices", IEEE Transactions on Information Theory, IEEE Press, USA, vol. 56, No. 3, XP011304647, ISSN: 0018-9448, Mar. 1, 2010, pp. 1038-1047.

\* cited by examiner

DEVICES AND METHODS FOR RECONSTRUCTING CORRUPTED CONTROL CHANNEL BITS

CLAIM OF PRIORITY UNDER 35 U.S.C. §119

The present Application for Patent claims priority to Provisional Application No. 61/859,084 entitled "Apparatus and Method For HS-SCCH Control Channel Recovery" filed Jul. 26, 2013, and assigned to the assignee hereof and hereby expressly incorporated by reference herein.

TECHNICAL FIELD

The technology discussed below relates generally to wireless communications, and more specifically to methods and devices for facilitating reconstruction of a segment of corrupted bits.

BACKGROUND

Wireless communication networks are widely deployed to provide various communication services such as telephony, video, data, messaging, broadcasts, and so on. Such networks, which are usually multiple access networks, support communications for multiple users by sharing the available network resources. One example of such a network is the UMTS Terrestrial Radio Access Network (UTRAN). The UTRAN is the radio access network (RAN) defined as a part of the Universal Mobile Telecommunications System (UMTS), a third generation (3G) mobile phone technology supported by the 3rd Generation Partnership Project (3GPP). UMTS, which is the successor to Global System for Mobile Communications (GSM) technologies, currently supports various air interface standards, such as Wideband-Code Division Multiple Access (W-CDMA), Time Division-Code Division Multiple Access (TD-CDMA), and Time Division-Synchronous Code Division Multiple Access (TD-SCDMA). UMTS also supports enhanced 3G data communications protocols, such as High Speed Packet Access (HSPA), which provides higher data transfer speeds and capacity to associated UMTS networks.

As the demand for mobile broadband access continues to increase, research and development continue to advance the UMTS technologies not only to meet the growing demand for mobile broadband access, but to advance and enhance the user experience with mobile communications.

BRIEF SUMMARY OF SOME EXAMPLES

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

Various examples and implementations of the present disclosure facilitate reconstruction of a segment of corrupted bits in a control channel. According to at least one aspect of the disclosure, user equipment (UEs) may include a communications interface and a storage medium, both coupled with a processing circuit. The processing circuit may be adapted to receive a control channel transmission via the communications interface, where the control channel transmission includes a plurality of information bits and a plurality of cyclic redundancy check (CRC) bits. The processing circuit may further determine that a contiguous segment of the information bits is corrupt, and utilize the uncorrupted information bits and the CRC bits to reconstruct the corrupt information bits.

Further aspects provide methods operational on UEs and/or UEs including means to perform such methods. One or more examples of such methods may include receiving a control channel transmission with a plurality of information bits and a plurality of cyclic redundancy check (CRC) bits. A determination may be made that a contiguous segment of the information bits is corrupt. This contiguous segment of corrupted information bits may be reconstructed by utilizing the received CRC bits and the received uncorrupted information bits.

Still further aspects include processor-readable storage mediums comprising programming executable by a processing circuit. According to one or more examples, such programming may be adapted for causing the processing circuit to receive a control channel transmission with a plurality of information bits and a plurality of cyclic redundancy check (CRC) bits. The programming may further be adapted for causing the processing circuit to determine that a contiguous segment of the information bits is corrupt, and reconstruct the contiguous segment of corrupt information bits by utilizing the received CRC bits and received uncorrupted information bits.

Other aspects, features, and embodiments associated with the present disclosure will become apparent to those of ordinary skill in the art upon reviewing the following description in conjunction with the accompanying figures.

DRAWINGS

DETAILED DESCRIPTION

The description set forth below in connection with the appended drawings is intended as a description of various configurations and is not intended to represent the only configurations in which the concepts and features described herein may be practiced. The following description includes specific details for the purpose of providing a thorough understanding of various concepts. However, it will be apparent to those skilled in the art that these concepts may be practiced without these specific details. In some instances, well known circuits, structures, techniques and components are shown in block diagram form to avoid obscuring the described concepts and features.

The various concepts presented throughout this disclosure may be implemented across a broad variety of telecommunication systems, network architectures, and communication standards. Certain aspects of the disclosure are described below for UMTS W-CDMA protocols and systems, and related terminology may be found in much of the following description. However, those of ordinary skill in the art will recognize that one or more aspects of the present disclosure may be employed and included in one or more other wireless communication protocols and systems.

Figure 1:
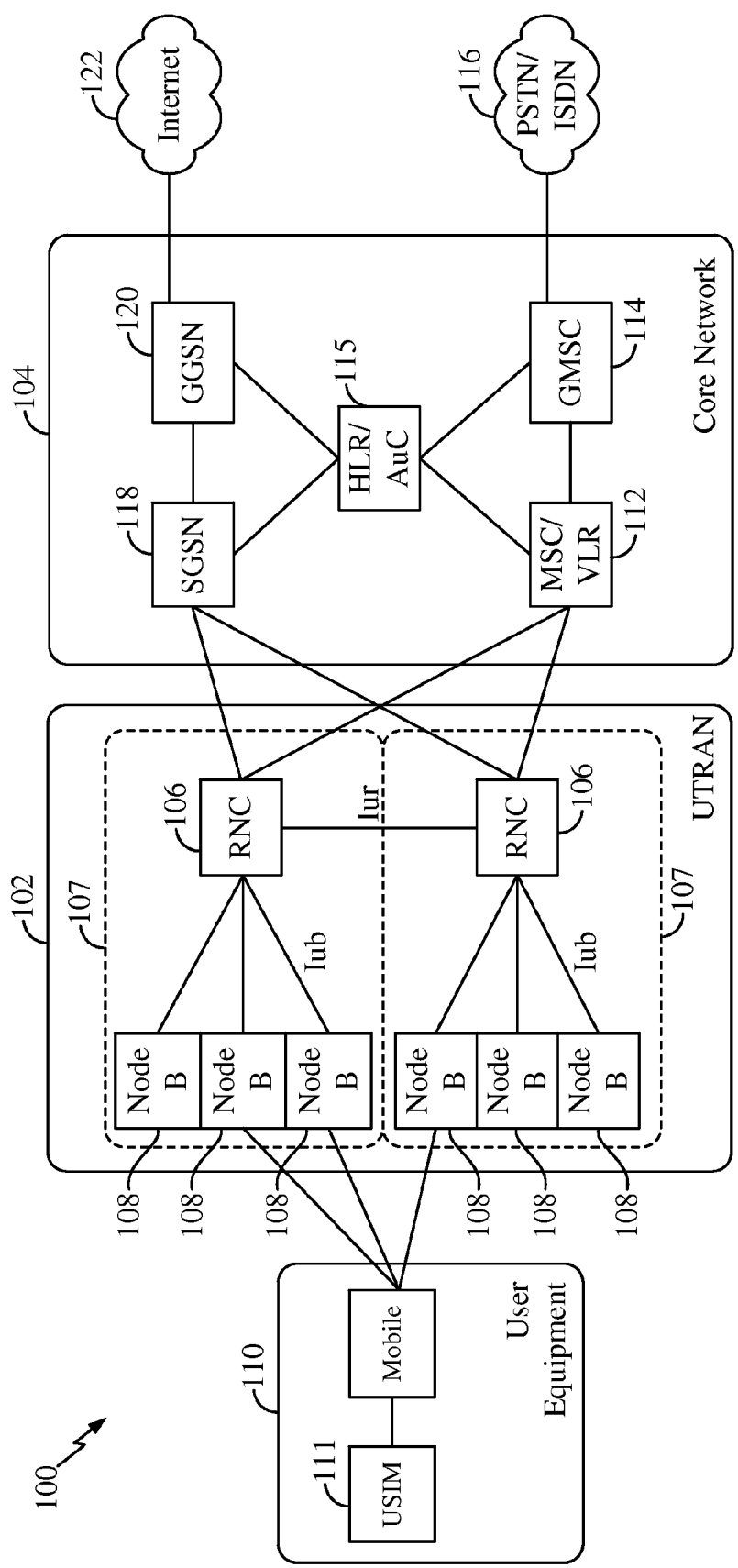
FIG. 1 is a block diagram conceptually illustrating an example of a telecommunications system.

The various concepts presented throughout this disclosure may be implemented across a broad variety of telecommunication systems, network architectures, and communication standards. Referring now to FIG. 1, as an illustrative example without limitation, various aspects of the present disclosure are illustrated with reference to a Universal Mobile Telecommunications System (UMTS) system 100. A UMTS network includes three interacting domains: a core network 104, a radio access network (RAN) (e.g., the UMTS Terrestrial Radio Access Network (UTRAN) 102), and a user equipment (UE) 110. Among several options available for a UTRAN 102, in this example, the illustrated UTRAN 102 may employ a W-CDMA air interface for enabling various wireless services including telephony, video, data, messaging, broadcasts, and/or other services. The UTRAN 102 may include a plurality of Radio Network Subsystems (RNSs) such as an RNS 107, each controlled by a respective Radio Network Controller (RNC) such as an RNC 106. Here, the UTRAN 102 may include any number of RNCs 106 and RNSs 107 in addition to the illustrated RNCs 106 and RNSs 107. The RNC 106 is an apparatus responsible for, among other things, assigning, reconfiguring, and releasing radio resources within the RNS 107. The RNC 106 may be interconnected to other RNCs (not shown) in the UTRAN 102 through various types of interfaces such as a direct physical connection, a virtual network, or the like using any suitable transport network.

The geographic region covered by the RNS 107 may be divided into a number of cells, with a radio transceiver apparatus serving each cell. A radio transceiver apparatus is commonly referred to as a Node B in UMTS applications, but may also be referred to by those skilled in the art as a base station (BS), a base transceiver station (BTS), a radio base station, a radio transceiver, a transceiver function, a basic service set (BSS), an extended service set (ESS), an access point (AP), or some other suitable terminology. For clarity, three Node Bs 108 are shown in each RNS 107; however, the RNSs 107 may include any number of wireless Node Bs.

The Node Bs 108 provide wireless access points to a core network 104 for any number of mobile apparatuses. Examples of a mobile apparatus include a cellular phone, a smart phone, a session initiation protocol (SIP) phone, a laptop, a notebook, a netbook, a smartbook, a personal digital assistant (PDA), a satellite radio, a global positioning system (GPS) device, a multimedia device, a video device, a digital audio player (e.g., MP3 player), a camera, a game console, or any other similar functioning device. The mobile apparatus is commonly referred to as user equipment (UE) in UMTS applications, but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. In a UMTS system, the UE 110 may further include a universal subscriber identity module (USIM) 111, which contains a user's subscription information to a network. For illustrative purposes, one UE 110 is shown in communication with a number of the Node Bs 108. The downlink (DL), also called the forward link, refers to the communication link from a Node B 108 to a UE 110 and the uplink (UL), also called the reverse link, refers to the communication link from a UE 110 to a Node B 108.

The core network 104 can interface with one or more access networks, such as the UTRAN 102. As shown, the core network 104 is a UMTS core network. However, as those skilled in the art will recognize, the various concepts presented throughout this disclosure may be implemented in a RAN, or other suitable access network, to provide UEs with access to types of core networks other than UMTS networks.

The illustrated UMTS core network 104 includes a circuit-switched (CS) domain and a packet-switched (PS) domain. Some of the circuit-switched elements are a Mobile services Switching Centre (MSC) 112, a Visitor Location Register (VLR) 112, and a Gateway MSC (GMSC) 114. Packet-switched elements include a Serving GPRS Support Node (SGSN) 118 and a Gateway GPRS Support Node (GGSN) 120. Some network elements, like EIR, HLR 115, VLR, and AuC 115 may be shared by both of the circuit-switched and packet-switched domains.

Figure 2:
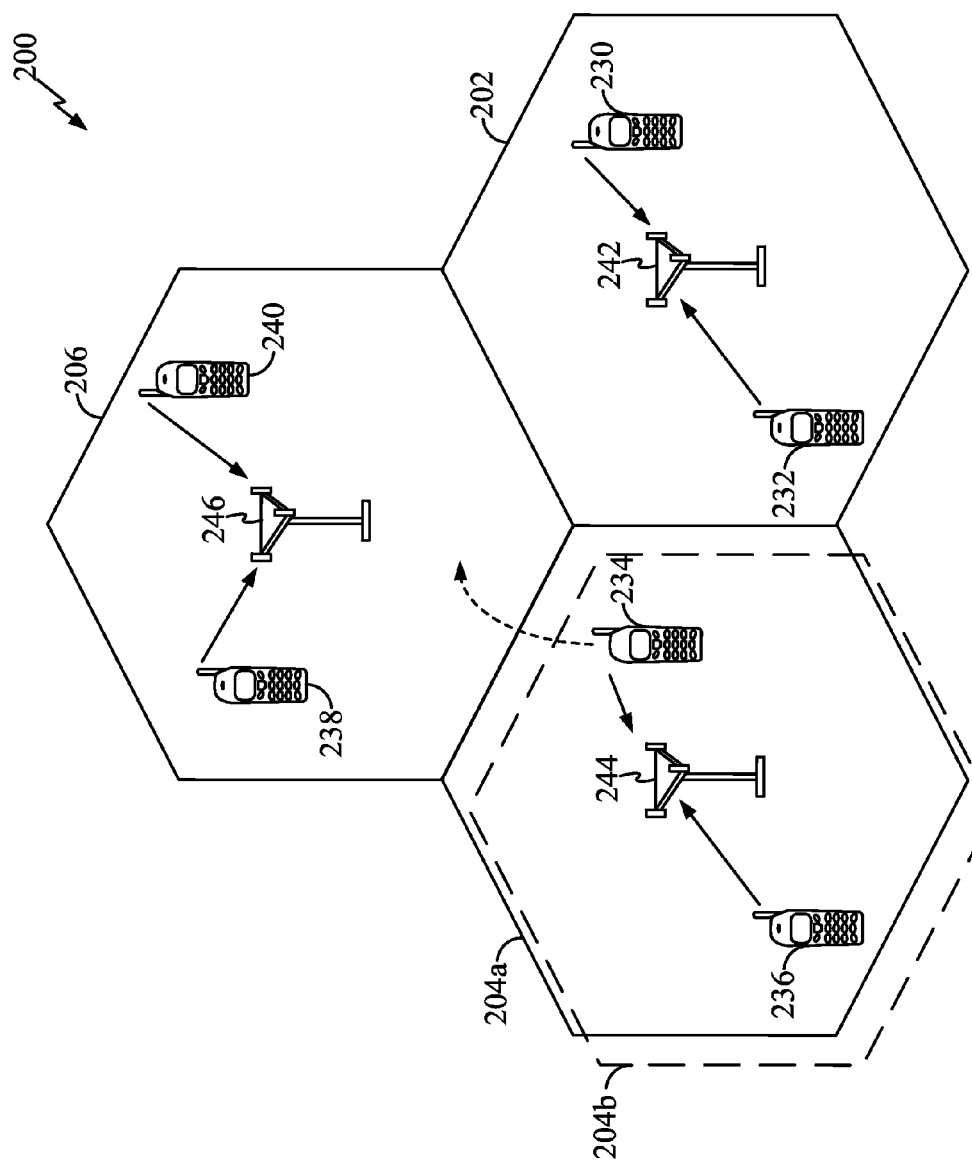
FIG. 2 is a conceptual diagram illustrating an example of an access network.

Referring to FIG. 2, by way of example and without limitation, a simplified schematic illustration of a RAN 200 in a UTRAN architecture is illustrated. The system includes multiple cellular regions (cells), including cells 202, 204, and 206, each of which may include one or more sectors. Cells may be defined geographically (e.g., by coverage area) and/or may be defined in accordance with a frequency, scrambling code, etc. That is, the illustrated geographically-defined cells 202, 204, and 206 may each be further divided into a plurality of cells, e.g., by utilizing different scrambling codes. For example, cell 204a may utilize a first scrambling code, and cell 204b, while in the same geographic region and served by the same Node B 244, may be distinguished by utilizing a second scrambling code. In a cell that is divided into sectors, the multiple sectors within a cell can be formed by groups of antennas with each antenna responsible for communication with UEs in a portion of the cell.

The cells 202, 204, and 206 may include several UEs that may be in communication with one or more sectors of each cell 202, 204, or 206. For example, UEs 230 and 232 may be in communication with Node B 242, UEs 234 and 236 may be in communication with Node B 244, and UEs 238 and 240 may be in communication with Node B 246. Here, each Node B 242, 244, and 246 may be configured to provide an access point to a core network 104 (see FIG. 1) for all the UEs 230, 232, 234, 236, 238, and 240 in the respective cells 202, 204, and 206.

During a call with a source cell, or at any other time, the UE 236 may monitor various parameters of the source cell as well as various parameters of neighboring cells. Further, depending on the quality of these parameters, the UE 236 may maintain communication with one or more of the neighboring cells. During this time, the UE 236 may maintain an Active Set, that is, a list of cells to which the UE 236 is simultaneously connected (i.e., the UTRAN cells that are currently assigning a downlink dedicated physical channel DPCH or fractional downlink dedicated physical channel F-DPCH to the UE 236 may constitute the Active Set).

The UTRAN air interface may be a spread spectrum Direct-Sequence Code Division Multiple Access (DS-CDMA) system, such as one utilizing the W-CDMA standards. The spread spectrum DS-CDMA spreads user data through multiplication by a sequence of pseudorandom bits called chips. The W-CDMA air interface for the UTRAN 102 is based on such DS-CDMA technology and additionally calls for a frequency division duplexing (FDD). FDD uses a different carrier frequency for the uplink (UL) and downlink (DL) between a Node B 108 and a UE 110. Another air interface for UMTS that utilizes DS-CDMA, and uses time division duplexing (TDD), is the TD-SCDMA air interface. Those skilled in the art will recognize that although various examples described herein may refer to a W-CDMA air interface, the underlying principles are equally applicable to a TD-SCDMA air interface or any other suitable air interface.

A high speed packet access (HSPA) air interface includes a series of enhancements to the 3G/W-CDMA air interface between the UE 110 and the UTRAN 102, facilitating greater throughput and reduced latency for users. Among other modifications over prior standards, HSPA utilizes hybrid automatic repeat request (HARQ), shared channel transmission, and adaptive modulation and coding. The standards that define HSPA include HSDPA (high speed downlink packet access) and HSUPA (high speed uplink packet access, also referred to as enhanced uplink or EUL).

For example, in Release 5 of the 3GPP family of standards, HSDPA was introduced. HSDPA utilizes as its transport channel the high-speed downlink shared channel (HS-DSCH), which may be shared by several UEs. The HS-DSCH is implemented by three physical channels: the high-speed physical downlink shared channel (HS-PDSCH), the high-speed shared control channel (HS-SCCH), and the high-speed dedicated physical control channel (HS-DPCCH).

The HS-DPCCH is an uplink physical channel that may carry feedback from the UE to assist the Node B in its scheduling algorithm. The feedback may include a channel quality indicator (CQI) and a positive or negative acknowledgement (ACK/NAK) of a previous HS-DSCH transmission.

The HS-SCCH is a physical channel that may be utilized to carry downlink control information related to the transmission of HS-DSCH. Here, the HS-DSCH may be associated with one or more HS-SCCH. The UE may continuously monitor the HS-SCCH to determine when to read its data from the HS-DSCH and to determine the modulation scheme used on the assigned physical channel.

The HS-PDSCH is a physical channel that may be shared by several UEs and may carry downlink data for the high-speed downlink. The HS-PDSCH may support quadrature phase shift keying (QPSK), 16-quadrature amplitude modulation (16-QAM), and multi-code transmission.

Figure 3:
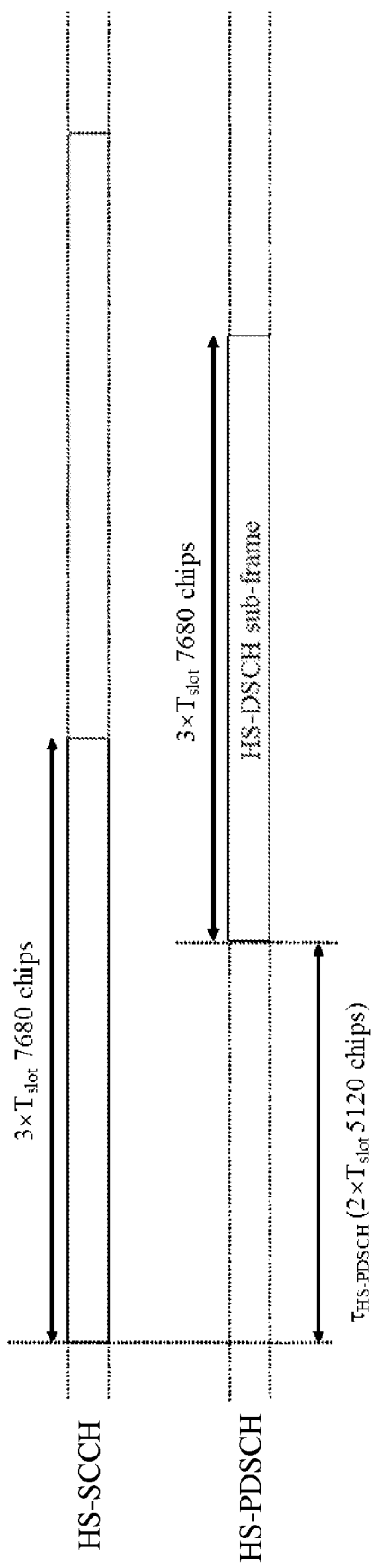
FIG. 3 is a timing diagram illustrating a received HS-SCCH and its corresponding HS-PDSCH.

FIG. 3 is a timing diagram illustrating the HS-SCCH and HS-PDSCH as they may be transmitted by the Node B in one example. As seen in this illustration, the HS-SCCH transmission time interval (TTI) is a 2-millisecond subframe in duration (i.e., 3 slots, or 7680 chips), and the HS-PDSCH is offset from the HS-SCCH by $\tau_{HS\text{-}PDSCH}$=2 slots. Consequently, there is an overlap of one slot between a HS-SCCH subframe and the corresponding HS-PDSCH subframe.

In various communications, a control channel transmission, such as the HS-SCCH transmission, can include two parts, namely Part 1 (e.g., first slot of the HS-SCCH subframe) and Part 2 (e.g., second and third slots of the HS-SCCH subframe). Both parts may be separately encoded with convolutional codes. Part 1 may include eight (8) information bits. Part 2 may contain thirteen (13) information bits, and sixteen (16) cyclic redundancy check (CRC) bits (generated from information bits from Parts 1 and Part 2), which are used to determine validity of the control channel (e.g., HS-SCCH) packet. If the CRC passes, the control channel (e.g., HS-SCCH) packet is considered valid and the UE attempts to decode the corresponding channel (e.g., HS-PDSCH) subframe with further control information present in Part 2 of the control channel (e.g., HS-SCCH Part 2). If the UE does not detect any CRC passes, the UE is not required to decode the corresponding channel (e.g., HS-PDSCH) subframe. Part 1 of the control channel (e.g., HS-SCCH Part 1) itself is not CRC-protected, and the CRC bits are constructed from information bits of both Part 1 and Part 2, and are transmitted in Part 2.

Figure 4:
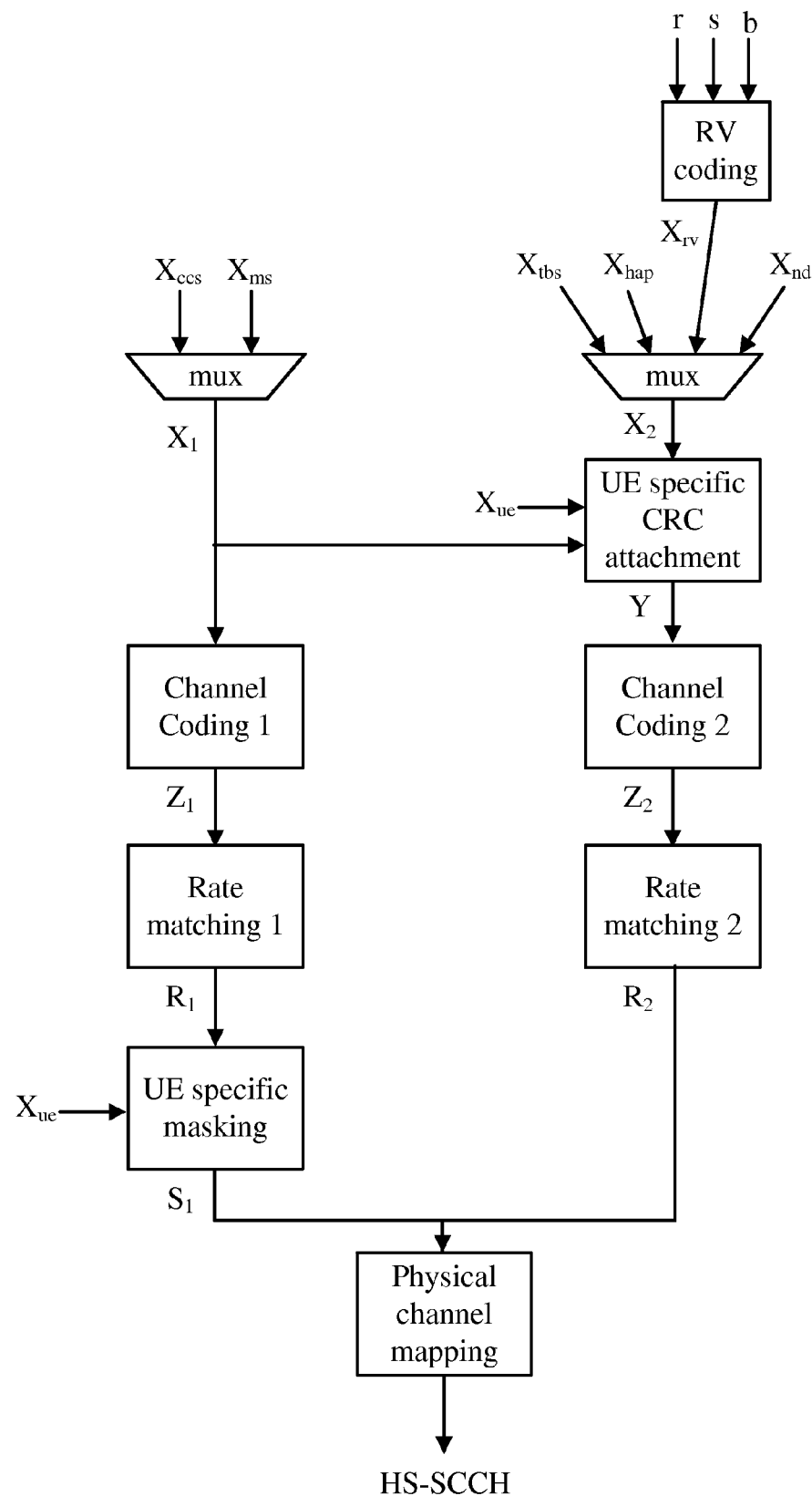
FIG. 4 is a schematic block diagram illustrating the encoding of the HS-SCCH according to at least one example.

FIG. 4 is a schematic block diagram illustrating the coding chain for HS-SCCH Type 1 packets. While the following example refers to HS-SCCH Type 1 discussed in detail in the present disclosure for clarity, those of ordinary skill in the art will understand that aspects of the present disclosure may be applied in a similar manner to HS-SCCH Type 2 (used for HS-SCCH-Less (HSL)) and Type 3 (used when the UE is in MIMO mode), as well as other similar control channels.

The HS-SCCH may have a spreading factor of 128. The 40 bits of $s_1$ may be converted into QPSK symbols and transmitted over the first slot of HS-SCCH. The 80 bits of $r_2$ may be converted into QPSK symbols and transmitted over the second and third slots of the HS-SCCH. Further information regarding the encoding of the HS-SCCH may be found in 3GPP TS 25.212, section 4.6, incorporated herein by reference.

In further detail, HS-SCCH Part 1 includes 8 information bits, 7 of which represent channelization information ($x_{ccs}$), and 1 of which represents modulation information ($x_{ms}$). A convolutional-coded and punctured version of these 8 bits is XORed with a convolutional-coded and punctured version of the 16-bit H-RNTI for the UE, to produce a 40-bit sequence, representing the 20 QPSK symbols transmitted over the first slot of the HS-SCCH. The channelization information embeds the physical location of the HS codes (i.e., the start location O and the number of codes P), and the modulation bit determines whether or not QPSK is used in HS-PDSCH. Thus, only $$240 = \binom{16}{2} \times 2$$

sequences for $x_1 = [x_{ccs}\ x_{ms}]$ represent valid channelization information, and this number may be less if not all 15 codes are supported (e.g. HSDPA Categories 6 or 8).

The special Part 1 sequence of [1 1 1 0 0 0 0 0] is used to indicate HS-SCCH orders. HS-SCCH orders are utilized for activation/deactivation of CPC, DC/MC-HSDPA, and a secondary uplink, as well as for an enhanced serving cell change. No corresponding HS-PDSCH is sent on HS-SCCH orders.

Thus, in summary, HS-SCCH Part 1 includes 8 information bits with up to 241 valid sequences, including the HS-SCCH order sequence. The number of possible sequences is reduced for HS categories that do not support 15 codes, e.g. HSDPA Category 6 or 8, and also reduced if features such as CPC, DC/MC-HSDPA, secondary uplink, and enhanced serving cell change are not supported.

HS-SCCH Part 2 includes 13 information bits, and 16 CRC bits. The 13 information bits represent 6 bits for TBS index ($x_{tbs}$), 3 bits for a HARQ process ID ($x_{hp}$), 3 bits for redundancy version ($x_{rv}$), and 1 bit for the new data indicator state ($x_{nd}$).

The 16 CRC bits are generated from both Part 1 and Part 2 information bits, reversed, and XORed with the H-RNTI. This is then appended to the Part 2 information bits, and subsequently convolution-coded and punctured to 80 bits, representing the 40 QPSK symbols transmitted over the second and third slots of the HS-SCCH. All $2^{13}$=8192 information bit sequences may be valid, although some sequences are invalid for HS-SCCH orders, and others may be invalid based on higher layer signaling, e.g. number of HARQ processes configured.

When 64QAM is configured, and if $x_{ms}$=1, then the first 6 bits of $x_{ccs}$ and the parity of the SCCH OVSF index (indexed from 1) determine the physical location of the HS codes (i.e., start location O and number of codes P). Further, the last bit of $x_{ccs}$ represents the higher order modulation type, namely, 0 represents 16QAM and 1 represents 64QAM.

A receiving UE can simultaneously monitor up to 4 HS-SCCH OVSF codes per carrier, as indicated by higher layers. When a control channel transmission is received, a UE decodes the bits corresponding to Part 1 and Part 2 from the received symbols on all OVSF codes, and computes the corresponding CRCs. A Viterbi decoder may be used to decode Part 1 and Part 2.

If the decoded CRC bits are consistent with the decoded information bits and the UE's H-RNTI, and if the decoded Part 1 bits correspond to a valid sequence, then the HS-SCCH for that OVSF is considered consistent. If the HS-SCCH Order sequence for Part 1 is detected, a further check can be performed on the decoded Part 2 bits for validity prior to sending HS-DPCCH.

If all the received HS-SCCH codes are discarded, then the UE considers the entire HS-SCCH invalid and registers a DTX (i.e., a discontinuous transmission). However, if at least one HS-SCCH code remains, the HS-SCCH is valid, and the UE may decode the HS-PDSCH utilizing the control information on the HS-SCCH, or apply the HS-SCCH order as needed.

In some examples, if 64QAM is not configured, and if the UE capability information element (IE) "Support for different HS-SCCHs in contiguous TTIs" is false, and if the last HS-SCCH was successfully decoded, then the UE need only consider the winning HS-SCCH code index on the prior TTI.

Within the scope of the present disclosure, a UE may be able to simultaneously access one or more wireless communications networks such as a GSM network, a UMTS network, an LTE network, a CDMA2000 network, a Wi-MAX network, or any other suitable radio access technology (RAT). That is, UEs may be adapted to support a plurality of subscriptions (e.g., via a plurality of subscriber identity modules (SIMs)).

Figure 5:
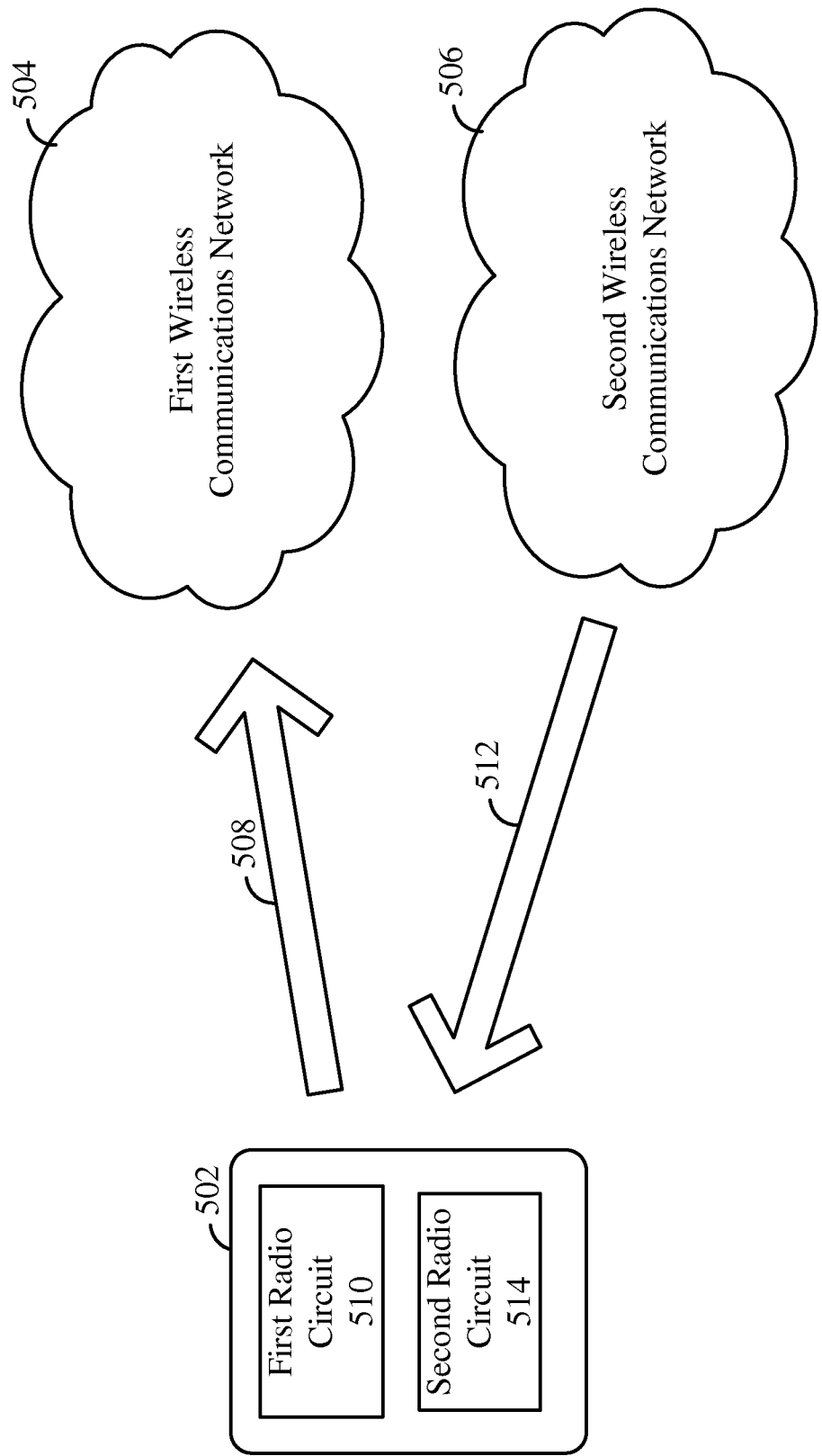
FIG. 5 is a conceptual diagram illustrating a UE configured to operate simultaneously in a first wireless communication network and a second wireless communication network according to some aspects of the disclosure

FIG. 5 is a conceptual diagram illustrating a UE 502 that can simultaneously operate in a first wireless communications network 504 of a first radio access technology (RAT) and a second wireless communications network 506 of a second RAT (e.g., a dual-SIM device). In one example, the first RAT may be LTE, and the second RAT may be UMTS implementing HSDPA. The first wireless communications network 504 and the second wireless communications network 506 may be associated with the same carrier or different carriers. Here, the UE 502 may be configured to be simultaneously active on both networks 504 and 506. For example, the UE 502 transmits first data 508 to the first wireless communications network 504 using a first radio access circuit 510, and receives second data 512 from the second wireless communications network 506 using a second radio access circuit 514. In one aspect, the first data 508 may be sent as an LTE transmission (aggressor's Tx), and the second data 512 may be received as an HSDPA reception (victim's Rx), e.g., including the HS-SCCH.

In a UE configured for simultaneous active operation utilizing two or more RATs (e.g., a dual-SIM device), there is the possibility of desensing, where symbols received utilizing one technology may be corrupted due to interference from the transmitter of the other technology. For example, when one of the technologies is HSDPA, symbols corresponding to HS-SCCH Part 1, HS-SCCH Part 2, and/or the corresponding HS-PDSCH for a given subframe number may become corrupted due to desensing. One problem may arise if only symbols corresponding to HS-SCCH Part 1 are corrupted due to desensing, causing the CRC (present in HS-SCCH Part 2) to fail. In such a case, as described above, the HS-SCCH would be treated as a DTX (discontinuous transmission, i.e., the UE considers the entire HS-SCCH not to have been received at all), and HS-PDSCH decoding would not be attempted. A similar problem arises if a portion of HS-SCCH is desensed, where the desensed symbols is contiguous and may cover a portion of HS-SCCH Part 1 and/or a portion of HS-SCCH Part 2.

Figure 6:
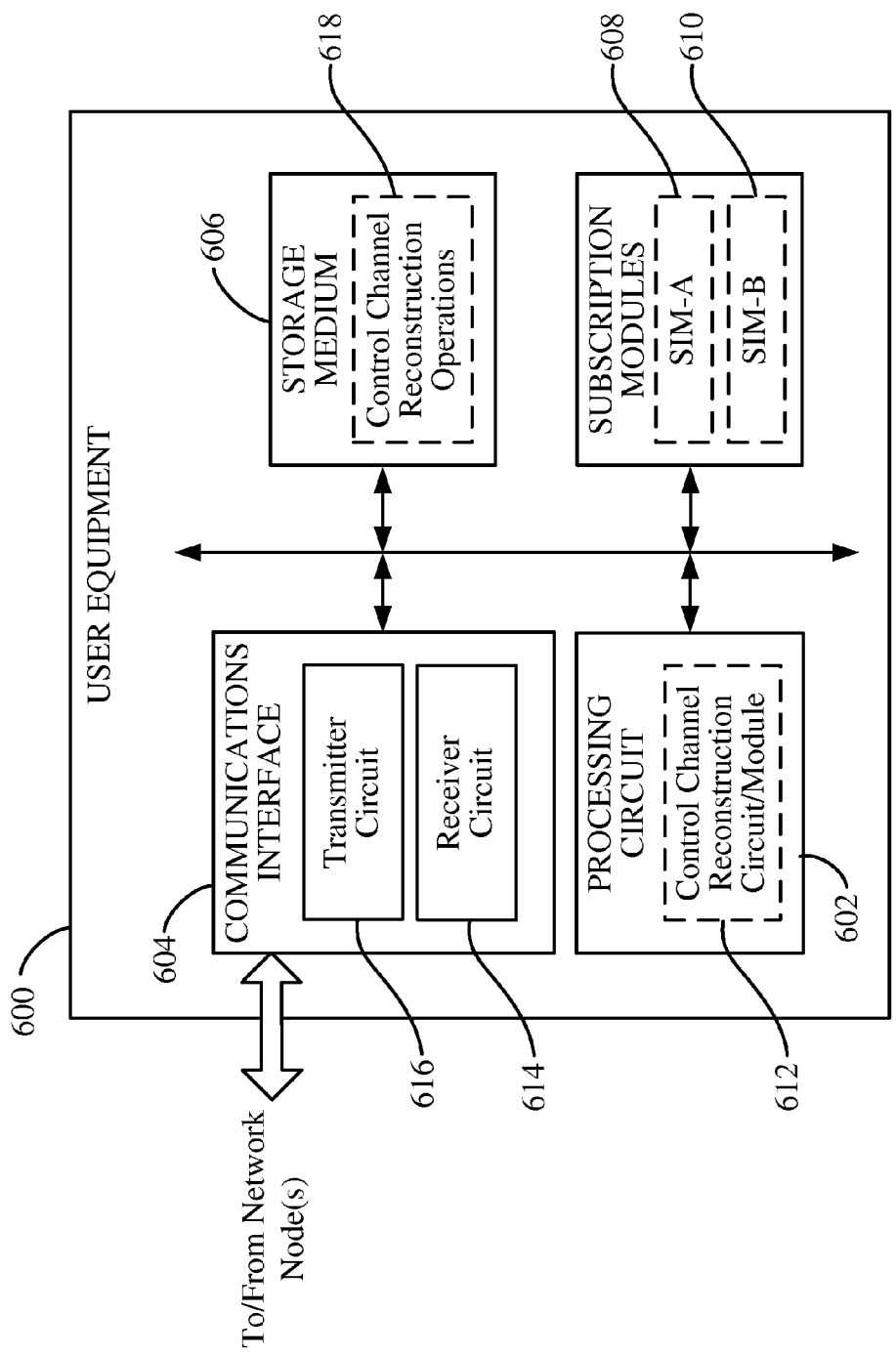
FIG. 6 is a block diagram illustrating select components of a UE according to at least one example.

According to an aspect of the present disclosure, UEs are adapted to recover Part 1 of a control channel (e.g., HS-SCCH Part 1) by using properties of the CRC present in Part 2 of the control channel (e.g., HS-SCCH Part 2), enabling the shared channel (e.g., HS-PDSCH) to be decoded even if Part 1 of the control channel (e.g., HS-SCCH Part 1) was not received. According to another aspect of the present disclosure, UEs are adapted to recover portions of Part 1 and/or Part 2 of a control channel by using properties of the CRC present in Part 2 of the control channel, enabling the shared channel to be decoded even if a contiguous portion of HS-SCCH in Part 1 and/or Part 2 was not received. FIG. 6 is a block diagram illustrating select components of a user equipment 600 according to at least one example of the present disclosure. The UE 600 includes a processing circuit 602 coupled to or placed in electrical communication with a communications interface 604 and a storage medium 606.

According to an aspect of the present disclosure, the UE 600 may be adapted to employ multiple subscriptions. Accordingly, the UE 600 can include two or more subscription modules represented generally by SIM-A 608 and SIM-B 610. The subscription modules 608, 610 may also be referred to interchangeably herein as a subscriber identity module (SIM). However, the one or more subscription modules may be one or more suitable subscription modules including, but not limited to, a Subscriber Identity Module (SIM), Removable User Identity Module (R-UIM), Universal Integrated Circuit Card (UICC), CDMA Subscriber Identity Module (CSIM), Universal Subscriber Identity Module (USIM), etc. SIM-A 608 and SIM-B 610 may be associated with a different service subscription, different network access over the same or different network type, and/or use the same or different radio access technologies.

The processing circuit 602 is arranged to obtain, process and/or send data, control data access and storage, issue commands, and control other desired operations. The processing circuit 602 may include circuitry adapted to implement desired programming provided by appropriate media in at least one example. For example, the processing circuit 602 may be implemented as one or more processors, one or more controllers, and/or other structure configured to execute executable programming Examples of the processing circuit 602 may include a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 602 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 602 are for illustration and other suitable configurations within the scope of the present disclosure are also contemplated.

The processing circuit 602 is adapted for processing, including the execution of programming, which may be stored on the storage medium 606. As used herein, the term "programming" shall be construed broadly to include without limitation instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

In some instances, the processing circuit 602 may include a control channel reconstruction circuit and/or module 612. The control channel reconstruction circuit/module 612 may include circuitry and/or programming (e.g., programming stored on the storage medium 606) adapted to reconstruct Part 1 of a control channel by using properties of the CRC present in Part 2 of the control channel.

The communications interface 604 is configured to facilitate wireless communications of the UE 600. For example, the communications interface 604 may include circuitry and/or programming adapted to facilitate the communication of information bi-directionally with respect to one or more wireless network devices (e.g., network nodes). The communications interface 604 may be coupled to one or more antennas (not shown), and includes wireless transceiver circuitry, including at least one receiver circuit 614 (e.g., one or more receiver chains) and/or at least one transmitter circuit 616 (e.g., one or more transmitter chains).

The storage medium 606 may represent one or more processor-readable devices for storing programming, such as processor executable code or instructions (e.g., software, firmware), electronic data, databases, or other digital information. The storage medium 606 may also be used for storing data that is manipulated by the processing circuit 602 when executing programming. The storage medium 606 may be any available media that can be accessed by a general purpose or special purpose processor, including portable or fixed storage devices, optical storage devices, and various other mediums capable of storing, containing and/or carrying programming. By way of example and not limitation, the storage medium 606 may include a processor-readable storage medium such as a magnetic storage device (e.g., hard disk, floppy disk, magnetic strip), an optical storage medium (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, and/or other mediums for storing programming, as well as any combination thereof.

The storage medium 606 may be coupled to the processing circuit 602 such that the processing circuit 602 can read information from, and write information to, the storage medium 606. That is, the storage medium 606 can be coupled to the processing circuit 602 so that the storage medium 606 is at least accessible by the processing circuit 602, including examples where the storage medium 606 is integral to the processing circuit 602 and/or examples where the storage medium 606 is separate from the processing circuit 602 (e.g., resident in the UE 600, external to the UE 600, distributed across multiple entities).

Programming stored by the storage medium 606, when executed by the processing circuit 602, causes the processing circuit 602 to perform one or more of the various functions and/or process steps described herein. For example, the storage medium 606 may include control channel reconstruction operations 618 adapted to cause the processing circuit 602 (e.g., the control channel reconstruction circuit/module 612) to reconstruct Part 1 of a control channel by using properties of the CRC present in Part 2 of the control channel, as described herein. Thus, according to one or more aspects of the present disclosure, the processing circuit 602 is adapted to perform (in conjunction with the storage medium 606) any or all of the processes, functions, steps and/or routines for any or all of the UEs described herein (e.g., UE 110, 230, 232, 234, 236, 238, 240, 502, 600). As used herein, the term "adapted" in relation to the processing circuit 602 may refer to the processing circuit 602 being one or more of configured, employed, implemented, and/or programmed (in conjunction with the storage medium 606) to perform a particular process, function, step and/or routine according to various features described herein.

In operation, the UE 600 can be adapted to recover Part 1 of a control channel (e.g., HS-SCCH Part 1) by using properties of the CRC present in Part 2 of the control channel (e.g., HS-SCCH Part 2), which can enable a shared channel (e.g., HS-PDSCH) to be decoded even if Part 1 of the control channel (e.g., HS-SCCH Part 1) was not received. For example, continuing with the example of the control channel being an HS-SCCH, when HS-SCCH Part 1 is at least partially desensed, erased, or otherwise corrupted, a UE may recover HS-SCCH Part 1 by performing HS-SCCH decoding based on HS-SCCH Part 2 alone, by utilizing properties of the CRC included in HS-SCCH Part 2. In this case, because the HS-SCCH Part 1 is 8 bits in length, and the CRC in HS-SCCH Part 2 is 16 bits in length, the 8 bits of information contained in HS-SCCH Part 1 can be efficiently reconstructed by using 8 of the 16 CRC bits present in HS-SCCH Part 2 to recover the 8 bits of erasure. Here, the remaining 8 bits of the CRC may be used for error detection. The reconstruction operation itself is effectively an instance of CRC construction. This makes the reconstruction operation very efficient.

In another operation, the UE 600 can be adapted to recover a contiguous segment of HS-SCCH which may span a portion of Part 1 and/or a portion of Part 2, by by using properties of the CRC present in Part 2 of the control channel, which can enable a shared channel to be decoded even if a contiguous portion of HS-SCCH in Part 1 and/or Part 2 was not received. For example, continuing with the example of the control channel being an HS-SCCH, when a contiguous portion of HS-SCCH Part 1 and/or HS-SCCH Part 2 is at least partially desensed, erased, or otherwise corrupted, a UE may recover that portion by performing HS-SCCH decoding based on the remaining HS-SCCH bits, by utilizing properties of the CRC included in HS-SCCH Part 2.

HS-SCCH Part 1, or a portion of HS-SCCH Part 1 and/or Part 2 can be corrupted due to desense or fading. Thus, while examples described below address desensing, those skilled in the art will comprehend that this is merely one example provided for clarity, and corruption of symbols may occur in HS-SCCH Part 1, or a portion of HS-SCCH Part 1 and/or Part 2, and be compensated as described in the present disclosure, in any UE utilizing HSDPA. The CRC used in the HS-SCCH is 16 bits in length. While the CRC is generally used for error detection, it may also be used for erasure recovery. However, in this case, for every one bit of erasure recovery, one bit is lost with error detection, which may cause an increase of false positives. In a further aspect of the present disclosure, this increase in potential false positives may be mitigated by additional checks on the decoded content of the HS-SCCH.

Figure 7:
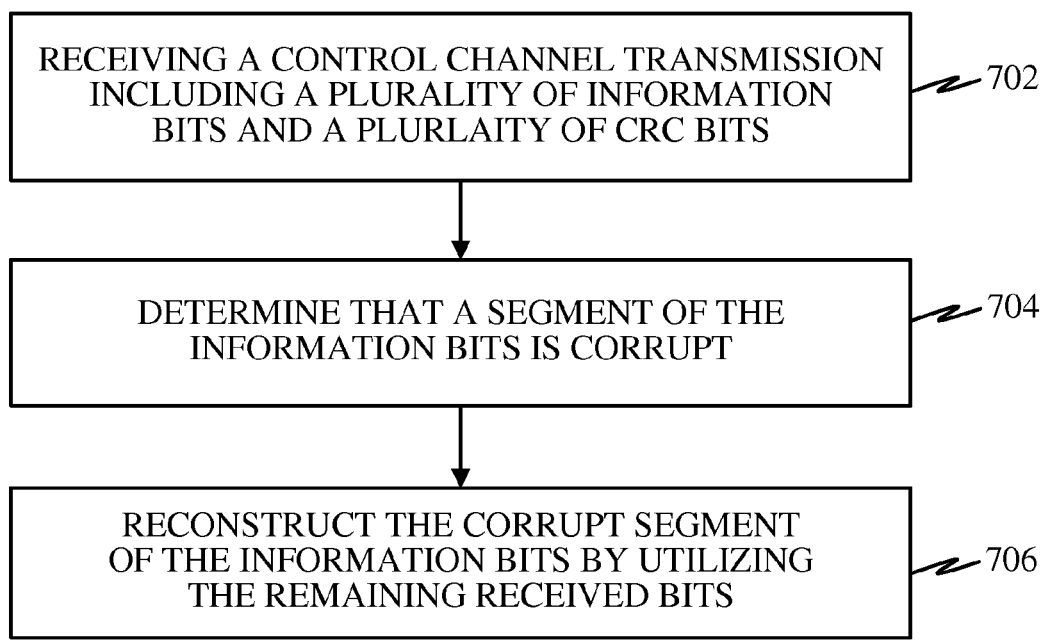
FIG. 7 is a flow diagram illustrating a method operational on an access terminal according to at least one example.

FIG. 7 is a flow diagram illustrating at least one example of a method operational on a user equipment, such as the UE 600. Referring to FIGS. 6 and 7, a UE 600 can receive a control channel transmission at 702. For example, the processing circuit 602 may receive a control channel transmission via the communications interface 604. The control channel transmission includes a plurality of information bits and a plurality of CRC bits. By way of example and not limitation, the control channel transmission may be a HS-SCCH transmission including a HS-SCCH Part 1 and a HS-SCCH Part 2. The processing circuit 602 can decode the received HS-SCCH on all OVSF codes it is monitoring, and compute the corresponding CRCs.

At 704, the UE 600 may determine that a segment of the information bits has been corrupted. Such corruption may be due to fading, desensing, or some other cause. In one example, the processing circuit 602 may determine that at least part of HS-SCCH Part 1 information bits are corrupted. In one example, the processing circuit 602 may determine that a contiguous segment of bits in the control channel have been corrupted. The contiguous segment may be in HS-SCCH Part 1, in HS-SCCH Part 2, or in both HS-SCCH Part 1 and HS-SCCH Part 2.

At 706, the UE 600 can reconstruct the corrupt segment of the information bits by utilizing the remaining received bits. For example, the processing circuit 602 (e.g., the control channel reconstruction circuit/module 612) executing the control channel reconstruction operations 618 may reconstruct the corrupt segment of the information bits based on the remaining received bits (e.g., the uncorrupt information bits and the received CRC bits).

Figure 8:
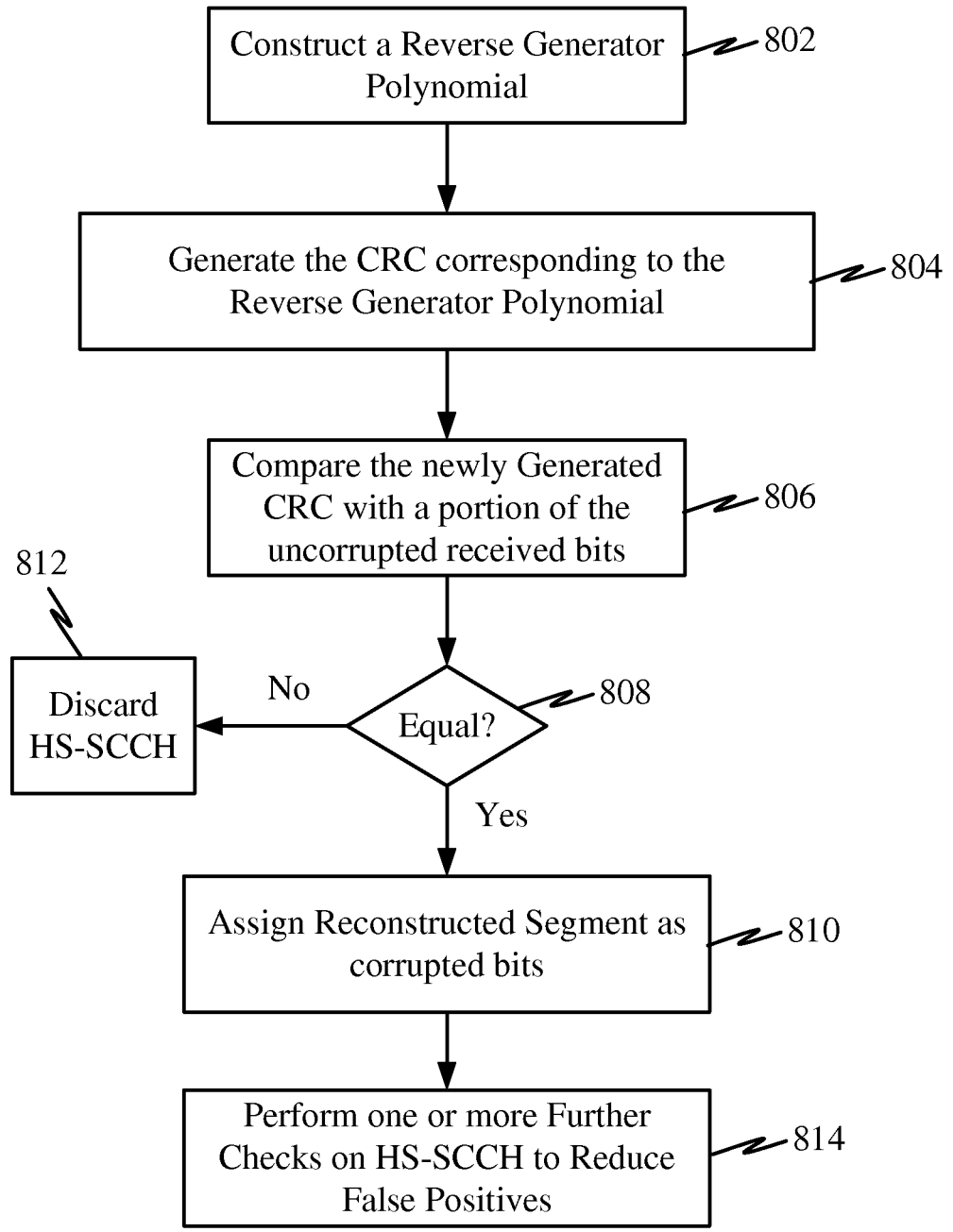
FIG. 8 is a flow diagram of at least one example of an algorithm for reconstructing the corrupt segment of information bits.

In some examples, the UE 600 can reconstruct the corrupt segment of the information bits by utilizing a new or changed generator polynomial. FIG. 8 is a flow diagram of at least one example of such an algorithm for reconstructing the corrupt segment of information bits. Initially, at step 802, the processing circuit 602 (e.g., the control channel reconstruction circuit/module 612) executing the control channel reconstruction operations 618 can construct a reverse generator polynomial corresponding to the original generator polynomial used in constructing the control channel transmission. For example, the original generator polynomial that is to be used according to the current specifications is 0x1021. The reverse generator polynomial corresponding to the original generator polynomial 0x1021 is 0x0811.

At step 804, the processing circuit 602 (e.g., the control channel reconstruction circuit/module 612) executing the control channel reconstruction operations 618 may generate a new 16-bit CRC corresponding to the reverse generator polynomial (e.g., 0x0811), which 16-bit CRC may be called R_rev. At step 806, the processing circuit 602 (e.g., the control channel reconstruction circuit/module 612) executing the control channel reconstruction operations 618 can compare the newly generated CRC with a portion of the uncorrupted received bits.

At decision diamond 808, the processing circuit 602 (e.g., the control channel reconstruction circuit/module 612) executing the control channel reconstruction operations 618 determines whether the generated CRC is consistent with a portion of the uncorrupted received bits. If the generated CRC is consistent with a portion of the uncorrupted received bits, then the CRC check is consistent and the reconstructed segment is assigned as the corrupted bits at step 810. Otherwise, the CRC check is inconsistent, and the HS-SCCH may be discarded at step 812.

The algorithm in FIG. 8 may be employed for examples where the corrupt segment is at least a part of a HS-SCCH Part 1, but not in Part 2, the processing circuit 602 (e.g., the control channel reconstruction circuit/module 612) executing the control channel reconstruction operations 618 can employ the CRC in Part 2. For example, referring to FIG. 8, the processing circuit 602 (e.g., the control channel reconstruction circuit/module 612) executing the control channel reconstruction operations 618 can construct a reverse generator polynomial corresponding to the original generator polynomial used in constructing the control channel transmission at step 802, such as 0x0811 for an original generator polynomial of 0x1021. At step 804, the processing circuit 602 (e.g., the control channel reconstruction circuit/module 612) executing the control channel reconstruction operations 618 can construct a portion of the received control channel message in reverse-bit order (M_rev), where M_rev=[crc_hat(16:−1:1) x2_hat(13:−1:9)]. Using the result of M_rev, the processing circuit 602 (e.g., the control channel reconstruction circuit/module 612) executing the control channel reconstruction operations 618 can generate the new 16-bit CRC using the reverse generator polynomial (e.g., 0x0811) with M_rev, which new CRC can be referred to as R_rev. At steps 806 and 808, if the portion of the generated CRC (R_rev(1:8)) is equal to the decoded bits that are available (x2_hat(8:−1:1)), then the CRC check is consistent, and the erased or corrupt bits (x1_hat) are assigned as being the same as the portion of the generated CRC (R_rev(16:−1:9)) at step 810. Otherwise, the CRC check is inconsistent, and the HS-SCCH may be discarded at step 812.

In another example where the corrupt segment is at least a part of the HS-SCCH Part 1, but not in Part 2, the processing circuit 602 (e.g., the control channel reconstruction circuit/module 612) executing the control channel reconstruction operations 618 can construct a reverse generator polynomial corresponding to the original generator polynomial used in constructing the control channel transmission at step 802, such as 0x0811 for an original generator polynomial of 0x1021. At step 804, processing circuit 602 (e.g., the control channel reconstruction circuit/module 612) executing the control channel reconstruction operations 618 can construct a portion of the received control channel message in reverse-bit order (M_rev), where M_rev=[crc_hat(16:−1:1) x2_hat(13:−1:1)]. Using the result of M_rev, the processing circuit 602 (e.g., the control channel reconstruction circuit/module 612) executing the control channel reconstruction operations 618 can generate the new 16-bit CRC using the reverse generator polynomial (e.g., 0x0811) with the received control channel message in reverse-bit order (M_rev), which generated new CRC can again be referred to as R_rev. At steps 806 and 808, if the portion of the generated CRC R_rev(9:16)=zeros(1,8) then the CRC check is consistent, and the erased or corrupt bits (x1_hat) are assigned as being the same as the portion of the generated CRC (R_rev(16:−1:9)) at step 810. Otherwise, the CRC check is inconsistent, and the HS-SCCH may be discarded at step 812.

Given these two examples, assuming that bits 1-8 of the HS-SCCH (all within Part 1) are considered corrupted, while the rest of the bits are not corrupt, the CRC generator polynomial used in constructing HS-SCCH can be 0x1021 representing $P(x)=x^{16}+x^{12}+x^5+1$. In other words, $$M(x) = \left(\sum_{i=1}^{8} x_{1,i} x^{i-1}\right) x^{29} + \left(\sum_{i=1}^{13} x_{2,i} x^{i-1}\right) x^{16} + \left(\sum_{i=1}^{16} crc_i x^{i-1}\right) = Q(x)P(x)$$

for some polynomial Q(x) of degree 20 (or less).

Replacing x by $x^{-1}$ and multiplying by $x^{36}$, and rearranging, yields:

$$\left(\sum_{i=1}^{16} crc_{17-i} x^{i-1}\right) x^{21} + \left(\sum_{i=1}^{13} x_{2,14-i} x^{i-1}\right) x^8 + \left(\sum_{i=1}^{8} x_{1,9-i} x^{i-1}\right) =$$

$$(Q(x^{-1})x^{20})(P(x^{-1})x^{16})$$

$Q(x^{-1})x^{20}$ is a polynomial of degree 20 (or less), and $P(x^{-1})x^{16}=x^{16}+x^{11}+x^4+1$. Hence, the sequence x2(8:−1:1) x1(8:−1:1) is the CRC bit sequence of crc(16:−1:1) x2(13:−1:9) using the generator polynomial 0x0811.

By multiplying the above equation on both sides by $x^8$, it immediately follows that the sequence: x1(8:−1:1) zeros(1,8) is the CRC bit sequence of crc(16:−1:1) x2(13:−1:1) using the generator polynomial 0x0811.

In the above two examples, it is assumed that the entirety of corrupted bits were in HS-SCCH Part 1 (containing 8 information bits). In other examples, where the corrupt segment is in either HS-SCCH Part 1, HS-SCCH Part 2, or both Part 1 and Part 2 the processing circuit 602 (e.g., the control channel reconstruction circuit/module 612) executing the control channel reconstruction operations 618 can employ the algorithm in FIG. 8 to recover essentially any contiguous segment of U corrupted bits in the HS-SCCH (e.g., in Part 1 and/or in Part 2), in accordance with information contained in the CRC and the other uncorrupted received bits.

In general, if a contiguous segment (including wrap-around) of the decoded information or CRC bits of the HS-SCCH is known to be corrupted, then according to an aspect of the present disclosure, this contiguous segment may be recovered. As an example, it can be assumed that it is known that the first U information bits of the HS-SCCH (i.e., U bits, starting at bit k, where k=1) are corrupt, and that recovery of these U bits is desired. Considering the 37-bit sequence as x̂ (x_hat), where the first U bits are corrupt. In this case, the algorithm in FIG. 8 can be employed by the processing circuit 602 (e.g., the control channel reconstruction circuit/module 612) executing the control channel reconstruction operations 618 to reconstruct the contiguous segment by initially constructing a reverse generator polynomial corresponding to the original generator polynomial used in constructing the control channel transmission at step 802, such as 0x0811 for an original generator polynomial of 0x1021. At step 804, processing circuit 602 (e.g., the control channel reconstruction circuit/module 612) executing the control channel reconstruction operations 618 can construct a portion of the received control channel message in reverse-bit order (M_rev), where M_rev=[x_hat(37:−1:(U+1))]. Using the result of M_rev, the processing circuit 602 (e.g., the control channel reconstruction circuit/module 612) executing the control channel reconstruction operations 618 can generate the new 16-bit CRC using the reverse generator polynomial (e.g., 0x0811) with the received control channel message in reverse-bit order (M_rev), which new CRC can again be referred to as R_rev. At steps 806 and 808, if R_rev((U+1):16)=zeros(1,16−U), then the CRC check is consistent, and x1_hat(1:U)=R_rev(U:−1:1) is determined at step 810. Otherwise, the CRC check is inconsistent, and the HS-SCCH may be discarded at step 812.

In a further aspect of the disclosure, a contiguous segment of bits in the HS-SCCH starting at bit k=2 may be recovered by utilizing a cyclic transformation. For example, the processing circuit 602 (e.g., the control channel reconstruction circuit/module 612) executing the control channel reconstruction operations 618 may construct a reverse generator polynomial according to the equation $M_1(x)=[xM(x)-x_{1,1}x^{21}P(x)+x_{1,1}P(x)]$, in which the original sequence M(x) is shifted to the left by 1 bit, and the MSB is moved to the LSB. Here, $M_1(x)$ remains a polynomial of degree 36 with new coefficients, say $[y_1, y_2, \ldots, y_{37}]$, with $y_1, \ldots, y_U$ being the bits desired for reconstruction. $x_{1,1}$ refers to the first bit (MSB) of HS-SCCH part 1. Then, applying the algorithm described above with reference to FIG. 8, utilizing $M_1(x)$ in place of M(x), the processing circuit 602 (e.g., the control channel reconstruction circuit/module 612) executing the control channel reconstruction operations 618 can obtain a solution y_hat(1:U))=R_rev(U:−1:1), which can be translated back to x_hat, in particular, for bits x_hat(2:U+1) by adding the bit $x_{1,1}$ to those bit locations which were impacted by the subtraction operation with the term $x_{1,1}x^{21}P(x)$ and addition operation with the term $x_{1,1}P(x)$ when constructing the polynomial $M_1(x)$.

Through an iterative process, one could apply the same algorithm above for the case k=3, and to other general values of k. For example, a new sequence $M_2(x)$ may be created that cyclically shifts the original sequence M(x) to the left by 2 bits, and moves the two MSBs to the two LSB locations. The new polynomial $M_2(x)$ may then be treated as the new M(x) for the algorithm described above.

A recovery algorithm may be generalized to any case wherein a contiguous segment of corrupted bits starts k bits (k=1, 2, ... ) after the first bit. That is, the reverse polynomial $M_k(x)$, which is a cyclic shift of the original sequence M(x) to the left by k bits, and the k MSBs, are moved to the k LSBs, is given by:

$$M_k(x) = \left[x^{k-1}M(x) - \sum_{i=1}^{k} x_{1,i} x^{21+k-i} P(x) + \sum_{i=1}^{k} x_{1,i} x^{k-i} P(x)\right]$$

Here, $x_{1,1}$ refers to the first bit (MSB) of HS-SCCH Part 1, and $x_{1,i}$ refers to the $i^{th}$ MSB of HS-SCCH Part 1. Treating the polynomial $M_k(x)$ as the new M(x), and repeating the steps described above when bits 1-6 in HS-SCCH Part 1 were corrupted. Finally, the processing circuit 602 (e.g., the control channel reconstruction circuit/module 612) executing the control channel reconstruction operations 618 can recover the original bits by adding the bits $x_{1,1}, \ldots, x_{1,k}$ to those bit locations that were impacted by the subtraction operation with the term $\sum_{i=1}^{k} x_{1,i} x^{21+k-i} P(x)$ and addition operation with the term $\sum_{i=1}^{k} x_{1,i} x^{k-i} P(x)$ when constructing the polynomial $M_k(x)$.

Referring still to FIG. 8, after the reconstructed segment is assigned as the corrupted bits at step 810, the processing circuit 602 (e.g., the control channel reconstruction circuit/module 612) executing the control channel reconstruction operations 618 can perform one or more further checks on the HS-SCCH to reduce false positives at step 814.

In at least one example, the processing circuit 602 (e.g., the control channel reconstruction circuit/module 612) executing the control channel reconstruction operations 618 may discard any HS-SCCH codes that fail additional HARQ conditions. For instance, if the HARQ process ID exceeds the configured number of HARQ process IDs by higher layers, then the processing circuit 602 (e.g., the control channel reconstruction circuit/module 612) executing the control channel reconstruction operations 618 may discard the decoded HS-SCCH. In another example, if the UE 600 is operating in the CELL_DCH state or the CELL_FACH state with a dedicated HRNTI, and if a MAC-hs or MAC-ehs PDU is received within 5 subframes from reception of a previous MAC-hs or MAC-ehs PDU intended for the HARQ process, then the processing circuit 602 (e.g., the control channel reconstruction circuit/module 612) executing the control channel reconstruction operations 618 may discard the decoded HS-SCCH. In yet another example, if the data in the soft buffer for the HARQ process has not been successfully decoded, and if the TBS is not identical to the last valid TBS signaled for the HARQ process or if TBS index is 111111, then the processing circuit 602 (e.g., the control channel reconstruction circuit/module 612) executing the control channel reconstruction operations 618 may discard the decoded HS-SCCH.

If the HS-SCCH codes decoded as described herein above were discarded (e.g., because the CRC check at operation 808 in FIG. 8 failed, or one or more further checks failed), then the processing circuit 602 (e.g., the control channel reconstruction circuit/module 612) executing the control channel reconstruction operations 618 may consider the received HS-SCCH to be a DTX, and the process may end without decoding the HS-PDSCH corresponding to the HS-SCCH. On the other hand, if any HS-SCCH codes are not discarded, then the processing circuit 602 (e.g., the control channel reconstruction circuit/module 612) executing the control channel reconstruction operations 618 may decode the corresponding HS-PDSCH in accordance with the decoded HS-SCCH.

Referring back to FIG. 7, in the examples of step 706 described above with reference to FIG. 8, the missing information bits (e.g., corrupt bits) are recovered using a new generator polynomial (e.g., the reverse generator polynomial). In other examples for step 706, the UE 600 can reconstruct the corrupt segment of information bits without changing the generator polynomial. For instance, the UE 600 can take advantage of the cyclic property of a full CRC codeword by zero padding and employing an error trapping mechanism to recover a burst of erased bits.

Figure 9:
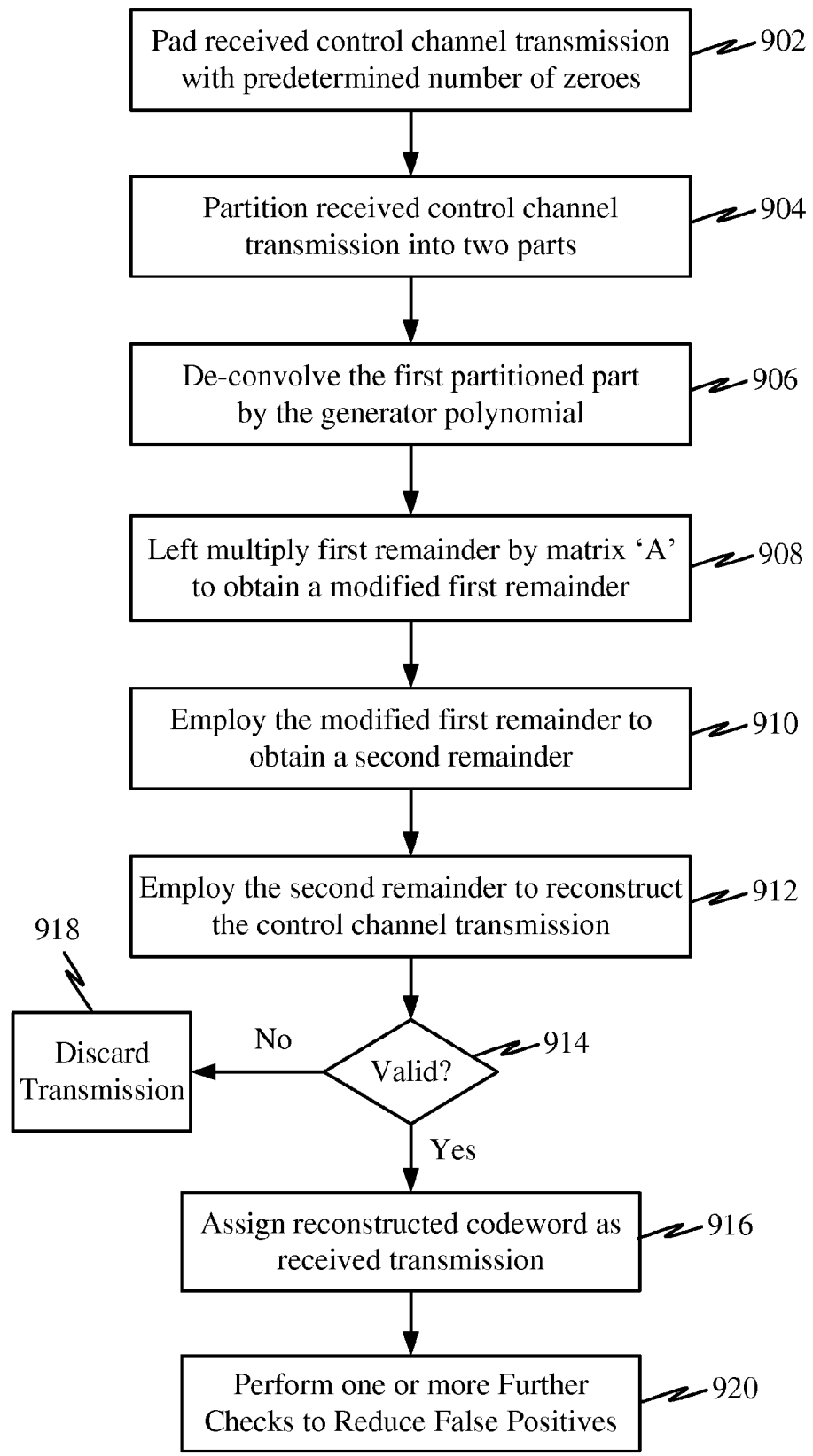
FIG. 9 is a flow diagram of at least one example of an algorithm for reconstructing the corrupt segment of information bits based on the original generator polynomial.

Referring to FIG. 9, a flow diagram of at least one example of an algorithm for reconstructing the corrupt segment of information bits based on the original generator polynomial is depicted. Initially, the processing circuit 602 (e.g., the control channel reconstruction circuit/module 612) executing the control channel reconstruction operations 618 can pad the received control channel transmission by a predetermined number of zeroes at step 902. In at least one example, the received codeword may be padded with 32,730 zeroes after the 37-bit codeword.

At 904, the processing circuit 602 (e.g., the control channel reconstruction circuit/module 612) executing the control channel reconstruction operations 618 can partition the received transmission into two parts. The first partitioned portion can include bits that are not corrupt and the second portion includes the corrupted segment. For instance, letting $\underline{c}=[c_1, c_2, \ldots, c_{37}]^T$ denote the received transmission as output from convolutional decoder, with the corrupt segment starting at index 'S,' i.e. $\underline{e}=[c_S, \ldots, c_{S+K-1}]^T$, and letting $\underline{p}$ denote the vector corresponding to the 16-CRC generator polynomial, $\underline{c}$ can be partitioned into the first portion $\underline{c}_1=[c_{min(16,S+K-1)+1}, \ldots, c_{37}]^T$ and the second portion $\underline{c}_2=[c_1, \ldots, c_{min(16,S+K-1)}]^T$. When the total number 'K' of corrupt bits is less than or equal to 16, the corrupt segment $\underline{e}$ corresponds to the last K bits of $\underline{c}_2$. Otherwise, the corrupt segment of bits ($\underline{e}$) is contained in the 16-bit vector $\underline{c}_2$.

At 906, the processing circuit 602 (e.g., the control channel reconstruction circuit/module 612) executing the control channel reconstruction operations 618 can de-convolve the first partitioned portion '$\underline{c}_1$' by the generator polynomial. The deconvolve operation can result in a first remainder '$\underline{r}_1$'. At operation 908, this first remainder '$\underline{r}_1$' may be left multiplied by a matrix '$\mathbb{A}$' to obtain a modified first remainder $\underline{r}'_1$. The matrix '$\mathbb{A}$' can efficiently enable the UE 600 to skip the predetermined number of zeroes employed to pad the control channel transmission. In general, the matrix '$\mathbb{A}$' can be based at least in part on the generator polynomial employed and on the number of zeroes used to pad the received transmission. In the example where the employed generator polynomial is 0x1021 described above, and where the predetermined number of zeroes is 32,730, the matrix '$\mathbb{A}$' would be as follows $$A = \begin{bmatrix} 0 & 1 & 0 & 1 & 1 & 1 & 0 & 0 & 1 & 1 & 0 & 0 & 0 & 1 & 0 \\ 1 & 0 & 1 & 0 & 1 & 1 & 1 & 0 & 0 & 1 & 1 & 0 & 0 & 0 & 1 \\ 0 & 1 & 0 & 1 & 0 & 1 & 1 & 1 & 0 & 0 & 1 & 1 & 0 & 0 & 0 \\ 0 & 0 & 1 & 0 & 1 & 0 & 1 & 1 & 1 & 0 & 0 & 1 & 1 & 0 & 0 \\ 0 & 1 & 0 & 0 & 1 & 0 & 0 & 1 & 0 & 0 & 0 & 0 & 1 & 1 & 1 & 0 \\ 0 & 0 & 1 & 0 & 0 & 1 & 0 & 0 & 1 & 0 & 0 & 0 & 0 & 1 & 1 & 1 \\ 1 & 0 & 0 & 1 & 0 & 0 & 1 & 0 & 0 & 1 & 0 & 0 & 0 & 0 & 1 & 1 \\ 0 & 1 & 0 & 0 & 1 & 0 & 0 & 1 & 0 & 0 & 1 & 0 & 0 & 0 & 0 & 1 \\ 0 & 0 & 1 & 0 & 0 & 1 & 0 & 0 & 1 & 0 & 0 & 1 & 0 & 0 & 0 & 0 \\ 0 & 0 & 0 & 1 & 0 & 0 & 1 & 0 & 0 & 1 & 0 & 0 & 1 & 0 & 0 & 0 \\ 1 & 0 & 0 & 0 & 1 & 0 & 0 & 1 & 0 & 0 & 1 & 0 & 0 & 1 & 0 & 0 \\ 1 & 0 & 0 & 1 & 1 & 0 & 0 & 0 & 0 & 1 & 0 & 1 & 0 & 0 & 0 & 0 \\ 1 & 1 & 0 & 0 & 1 & 1 & 0 & 0 & 0 & 0 & 1 & 0 & 1 & 0 & 0 & 0 \\ 1 & 1 & 1 & 0 & 0 & 1 & 1 & 0 & 0 & 0 & 0 & 1 & 0 & 1 & 0 & 0 \\ 0 & 1 & 1 & 1 & 0 & 0 & 1 & 1 & 0 & 0 & 0 & 0 & 1 & 0 & 1 & 0 \\ 1 & 0 & 1 & 1 & 1 & 0 & 0 & 1 & 1 & 0 & 0 & 0 & 0 & 1 & 0 & 1 \end{bmatrix}.$$

In another example, at 906, the processing circuit 602 (e.g., the control channel reconstruction circuit/module 612) executing the control channel reconstruction operations 618 can de-convolve the first partitioned portion '$\underline{c}_1$' by the generator polynomial. The deconvolve operation can result in a first remainder '$\underline{r}_1$'. Operation 908 may be bypassed by deconvolving this first remainder, further padded with 32,730 zeros, by the generator polynomial. The deconvolve operation results in a modified first remainder $\underline{r}'_1$.

At operation 910, the processing circuit 602 (e.g., the control channel reconstruction circuit/module 612) executing the control channel reconstruction operations 618 can employ the modified first remainder $\underline{r}'_1$ to obtain a second remainder $\underline{r}_2$. If the length of the corrupted segment is less than 16 (e.g., S+K−1≤16), the processing circuit 602 (e.g., the control channel reconstruction circuit/module 612) executing the control channel reconstruction operations 618 can determine the second remainder by deconvolving the modified first remainders $\underline{r}'_1$ padded with 16 zeroes (e.g., $[\underline{r}'_1{}^T \underline{0}^T]^T$) by the generator polynomial (which may be represented by the variable 'p'), resulting in a second remainder $\underline{r}_2$ (e.g., $[\underline{r}'_1{}^T \underline{0}^T]^T = p*\underline{q}_2 + \underline{r}_2 \cdot \underline{0}^T$, which is an all zero vector with a length of 16).

On the other hand, if the length of the corrupted segment is greater than 16 (e.g., S+K−1>16), then the processing circuit 602 (e.g., the control channel reconstruction circuit/module 612) executing the control channel reconstruction operations 618 can determine the second remainder $\underline{r}_2$ by first concatenating the bits of the corrupted segment that were greater than 16, and then deconvolving the modified first remainder $\underline{r}'_1$, the concatenated bits, and 16 zeroes appended at the end (e.g., $[\underline{r}'_1{}^T c_{2,1:S+K-17}{}^T \underline{0}^T]^T$) by the generator polynomial 'P'. The result is $[\underline{r}'_1{}^T c_{2,1:S+K-17}{}^T \underline{0}^T]^T) = \underline{p}*\underline{q}_2 + \underline{r}_2 \cdot \underline{0}^T = [0, \ldots, 0]$, which is an all zero vector with a length of 16, and $c_{2,1:S+K-17}{}^T = [c_1 \ldots c_{S+K-17}]$, which is the sub-vector consisting of the first S+K−17 entries of $\underline{c}_2$.

At operation 912, the processing circuit 602 (e.g., the control channel reconstruction circuit/module 612) executing the control channel reconstruction operations 618 can employ the second remainder $\underline{r}_2$ to reconstruct the control channel transmission with the recovered codeword. For example, where the length of the corrupted segment was less than 16 (e.g., S+K−1≤16), the processing circuit 602 (e.g., the control channel reconstruction circuit/module 612) executing the control channel reconstruction operations 618 can reconstruct the received control channel transmission by concatenating the partitioned segment from operation 904 that is believed to not be corrupted (e.g., the first portion $\underline{c}_1$) to the second remainder $\underline{r}_2$ (e.g., $\underline{c}_{rec} = [\underline{r}_2{}^T, \underline{c}_1{}^T]^T$).

In other examples where the length of the corrupted segment was greater than 16 (e.g., S+K−1>16), the processing circuit 602 (e.g., the control channel reconstruction circuit/module 612) executing the control channel reconstruction operations 618 can reconstruct the received control channel transmission by concatenating the partitioned segment from operation 904 that is believed to not be corrupted (e.g., the first portion $\underline{c}_1$) to the second remainder $\underline{r}_2$ and the first S+K−17 entries of $\underline{c}_2$ (e.g., $\underline{c}_{rec} = [c_{2,1:S+K}{}^T \underline{r}_2{}^T \underline{c}_1{}^T]^T$).

At decision diamond 914, the processing circuit 602 (e.g., the control channel reconstruction circuit/module 612) executing the control channel reconstruction operations 618 can determine whether the reconstructed codeword is valid. More specifically, the received and decoded codeword $\underline{c}$ is compared with the reconstructed codeword $\underline{c}_{rec}$ and the locations where the two codewords differ is determined. The set of flipped bits can be denoted as D and the set of reported erasure bits can be denoted as ϵ. If $D \subseteq \epsilon$, the reconstructed codeword $\underline{c}_{rec}$ is considered a valid reconstruction of actual transmitted codeword, and the reconstructed codeword $\underline{c}_{rec}$ is assigned for the received transmission at operation 916. Otherwise, the transmission is discarded at operation 918.

If the reconstructed codeword $\underline{c}_{rec}$ is assigned at step 916, the processing circuit 602 (e.g., the control channel reconstruction circuit/module 612) executing the control channel reconstruction operations 618 can perform one or more further checks on the control channel transmission to reduce false positives at step 920. In at least one example, the processing circuit 602 (e.g., the control channel reconstruction circuit/module 612) executing the control channel reconstruction operations 618 may discard any control channel codes that fail additional HARQ conditions, as described above with reference to FIG. 8.

If the codeword is not discarded, then the processing circuit 602 (e.g., the control channel reconstruction circuit/module 612) executing the control channel reconstruction operations 618 may decode the corresponding HS-PDSCH in accordance with the reconstructed codeword for the HS-SCCH.

While the above discussed aspects, arrangements, and embodiments are discussed with specific details and particularity, one or more of the components, steps, features and/or functions illustrated in FIGS. 1, 2, 3, 4, 5, 6, 7, and/or 8 may be rearranged and/or combined into a single component, step, feature or function or embodied in several components, steps, or functions. Additional elements, components, steps, and/or functions may also be added or not utilized without departing from the present disclosure. The apparatus, devices and/or components illustrated in FIGS. 1, 2, 5, and/or 6 may be configured to perform or employ one or more of the methods, features, parameters, and/or steps described in FIGS. 3, 4, 7, and/or 8. The novel algorithms described herein may also be efficiently implemented in software and/or embedded in hardware.

While features of the present disclosure may have been discussed relative to certain embodiments and figures, all embodiments of the present disclosure can include one or more of the advantageous features discussed herein. In other words, while one or more embodiments may have been discussed as having certain advantageous features, one or more of such features may also be used in accordance with any of the various embodiments discussed herein. In similar fashion, while exemplary embodiments may have been discussed herein as device, system, or method embodiments, it should be understood that such exemplary embodiments can be implemented in various devices, systems, and methods.

Also, it is noted that at least some implementations have been described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function. The various methods described herein may be partially or fully implemented by programming (e.g., instructions and/or data) that may be stored in a processor-readable storage medium, and executed by one or more processors, machines and/or devices.

Those of skill in the art would further appreciate that the various illustrative logical blocks, modules, circuits, and algorithm steps described in connection with the embodiments disclosed herein may be implemented as hardware, software, firmware, middleware, microcode, or any combination thereof. To clearly illustrate this interchangeability, various illustrative components, blocks, modules, circuits, and steps have been described above generally in terms of their functionality. Whether such functionality is implemented as hardware or software depends upon the particular application and design constraints imposed on the overall system.

The various features associate with the examples described herein and shown in the accompanying drawings can be implemented in different examples and implementations without departing from the scope of the present disclosure. Therefore, although certain specific constructions and arrangements have been described and shown in the accompanying drawings, such embodiments are merely illustrative and not restrictive of the scope of the disclosure, since various other additions and modifications to, and deletions from, the described embodiments will be apparent to one of ordinary skill in the art. Thus, the scope of the disclosure is only determined by the literal language, and legal equivalents, of the claims which follow.

What is claimed is:

1. A user equipment, comprising:
a communications interface;
a storage medium; and
a processing circuit coupled to the communications interface and the storage medium, the processing circuit adapted to:
receive a control channel transmission via the communications interface, wherein the control channel transmission comprises a plurality of information bits and a plurality of cyclic redundancy check (CRC) bits;
determine that a contiguous segment of the information bits is corrupt; and
utilize uncorrupted information bits and the CRC bits to reconstruct the corrupt information bits.

2. The user equipment of claim 1, wherein the received control channel transmission comprises a high-speed shared control channel (HS-SCCH) transmission with HS-SCCH Part 1 and HS-SCCH Part 2.

3. The user equipment of claim 2, wherein the contiguous segment of corrupt information bits comprises at least part of the HS-SCCH Part 1, at least part of the HS-SCCH Part 2, or parts of both HS-SCCH Part 1 and HS-SCCH Part 2.

4. The user equipment of claim 1, wherein the processing circuit adapted to utilize the uncorrupted information bits and the CRC bits to reconstruct the corrupt information bits comprises the processing circuit adapted to:
reconstruct the corrupt information bits based on a reverse generator polynomial.

5. The user equipment of claim 4, wherein the contiguous segment of corrupted bits starts k bits after the first bit, and wherein the processing circuit is adapted to:
construct a new sequence by a cyclic shift of the original received information bits and CRC sequence to the left by k bits and the k most significant bits are moved to the k least significant bits.

6. The user equipment of claim 1, wherein the processing circuit adapted to utilize the uncorrupted information bits and the CRC bits to reconstruct the corrupt information bits comprises the processing circuit adapted to:
reconstruct the corrupt information bits based on the original generator polynomial.

7. The user equipment of claim 1, wherein the processing circuit is further adapted to:
perform at least one check on the reconstructed information bits; and
discard the received control channel transmission if the at least one check fails.

8. The user equipment of claim 7, wherein the processing circuit adapted to perform the at least one check on the reconstructed information bits comprises the processing circuit adapted to:
determine whether a hybrid automatic repeat request (HARQ) process identifier (ID) exceeds a number of HARQ process IDs configured by higher layers.

9. The user equipment of claim 7, wherein the processing circuit adapted to perform the at least one check on the reconstructed information bits comprises the processing circuit adapted to:
determine whether the user equipment (UE) is operating in a Cell Dedicated Channel (CELL_DCH) state or a Cell Forward Access Channel (CELL_FACH) state with a dedicated High-Speed Dedicated Shared Channel (HS-DSCH) Radio Network Temporary Identifier (H-RNTI); and
determine whether a Medium Access Control-high-speed (MAC-hs) or Medium Access Control-evolution high-speed (MAC-ehs) protocol data unit (PDU) corresponding to a hybrid automatic repeat request (HARQ) process is received within 5 subframes from reception of a previous MAC-hs or MAC-ehs PDU intended for the HARQ process.

10. The user equipment of claim 7, wherein the processing circuit adapted to perform the at least one check on the reconstructed information bits comprises the processing circuit adapted to:
determine whether data in a soft buffer for a hybrid automatic repeat request (HARQ) process has not been successfully decoded; and
determine whether a Transport Block Size (TBS) is not identical to a last valid TBS signaled for the HARQ process.

11. A method operational on a user equipment, comprising:
receiving a control channel transmission comprising a plurality of information bits and a plurality of cyclic redundancy check (CRC) bits;
determining that a contiguous segment of the information bits is corrupt; and
reconstructing the contiguous segment of corrupt information bits by utilizing the received CRC bits and uncorrupted information bits.

12. The method of claim 11, wherein receiving the control channel transmission comprises:
receiving a high-speed shared control channel (HS-SCCH) transmission with HS-SCCH Part 1 and HS-SCCH Part 2.

13. The method of claim 11, wherein reconstructing the contiguous segment of corrupt information bits by utilizing the received CRC bits and uncorrupted information bits comprises:
reconstructing the corrupt information bits based on a reverse generator polynomial.

14. The method of claim 13, wherein the contiguous segment of corrupted bits starts k bits after the first bit, and wherein reconstructing the corrupt information bits based on the reverse generator polynomial comprises:
constructing a new sequence by cyclic shifting of the original received information and CRC sequence to the left by k bits and moving the k most significant bits to the k least significant bits.

15. The method of claim 11, wherein reconstructing the contiguous segment of corrupt information bits by utilizing the received CRC bits and uncorrupted information bits comprises:
reconstructing the corrupt information bits based on the original generator polynomial.

16. The method of claim 11, further comprising:
performing at least one check on the reconstructed information bits; and
discarding the received control channel transmission if the at least one check fails.

17. The method of claim 16, wherein performing at least one check on the reconstructed information bits comprises:
determining whether a hybrid automatic repeat request (HARQ) process ID exceeds a number of HARQ process IDs configured by higher layers.

18. The method of claim 16, wherein performing at least one check on the reconstructed information bits comprises:

determining whether the user equipment (UE) is operating in a Cell Dedicated Channel (CELL_DCH) state or a Cell Forward Access Channel (CELL_FACH) state with a dedicated High-Speed Dedicated Shared Channel (HS-DSCH) Radio Network Temporary Identifier (H-RNTI); and determining whether a Medium Access Control-high-speed (MAC-hs) or Medium Access Control-evolution high-speed (MAC-ehs) protocol data unit (PDU) corresponding to a hybrid automatic repeat request (HARQ) process is received within 5 subframes from reception of a previous MAC-hs or MAC-ehs PDU intended for the HARQ process.

19. The method of claim 16, wherein performing at least one check on the reconstructed information bits comprises:

determining whether data in a soft buffer for a hybrid automatic repeat request (HARQ) process has not been successfully decoded; and determining whether a Transport Block Size (TBS) is not identical to a last valid TBS signaled for the HARQ process.

20. A user equipment, comprising:

means for receiving a control channel transmission comprising a plurality of information bits and a plurality of cyclic redundancy check (CRC) bits;

means for determining that a contiguous segment of the information bits is corrupt; and means for reconstructing the contiguous segment of corrupt information bits by utilizing the received CRC bits and received uncorrupted information bits.

21. The user equipment of claim 20, wherein the means for reconstructing the contiguous segment of corrupt information bits by utilizing the received CRC bits and received uncorrupted information bits comprises:

means for reconstructing the corrupt information bits based on a new generator polynomial.

22. The user equipment of claim 21, wherein the contiguous segment of corrupted bits starts k bits after the first bit, and wherein the means for reconstructing the corrupt information bits based on a new CRC generator polynomial comprises:

means for constructing a new sequence by a cyclic shift of the original received information and CRC sequence to the left by k bits and the k most significant bits are moved to the k least significant bits.

23. The user equipment of claim 20, wherein the means for reconstructing the contiguous segment of corrupt information bits by utilizing the received CRC bits and received uncorrupted information bits comprises:

means for reconstructing the corrupt information bits based on the original generator polynomial.

24. The user equipment of claim 20, further comprising:

means for performing at least one check on the reconstructed information bits; and means for discarding the received control channel transmission if the at least one check fails.

25. A processor-readable storage medium, comprising programming for causing a processing circuit to:

receive a control channel transmission comprising a plurality of information bits and a plurality of cyclic redundancy check (CRC) bits;

determine that a contiguous segment of the information bits is corrupt; and reconstruct the contiguous segment of corrupt information bits by utilizing the received CRC bits and received uncorrupted information bits.

26. The processor-readable storage medium of claim 25, wherein the programming for causing a processing circuit to reconstruct the contiguous segment of corrupt information bits by utilizing the received CRC bits and received uncorrupted information bits comprises programming for causing a processing circuit to:

reconstruct the corrupt information bits based on a new CRC generator polynomial.

27. The processor-readable storage medium of claim 26, wherein the contiguous segment of corrupted bits starts k bits after the first bit, and further comprising programming for causing a processing circuit to:

construct a new sequence by cyclic shifting of the original received information and CRC sequence to the left by k bits and moving the k most significant bits to the k least significant bits.

28. The processor-readable storage medium of claim 25, wherein the programming for causing a processing circuit to reconstruct the contiguous segment of corrupt information bits by utilizing the received CRC bits and received uncorrupted information bits comprises programming for causing a processing circuit to:

reconstruct the corrupt information bits based on the original generator polynomial.

29. The processor-readable storage medium of claim 25, further comprising programming for causing a processing circuit to:

perform at least one check on the reconstructed information bits; and discard the received control channel transmission if the at least one check fails.

* * * * *